United States Patent
Sumino et al.

(10) Patent No.: US 9,627,282 B2
(45) Date of Patent: Apr. 18, 2017

(54) METHOD OF MANUFACTURING SEMICONDUCTOR DEVICE

(71) Applicant: Mitsubishi Electric Corporation, Tokyo (JP)

(72) Inventors: Tasuku Sumino, Tokyo (JP); Takayuki Hisaka, Tokyo (JP); Takahiro Nakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/091,423

(22) Filed: Apr. 5, 2016

(65) Prior Publication Data

US 2016/0343624 A1  Nov. 24, 2016

(30) Foreign Application Priority Data

May 20, 2015  (JP) .................................. 2015-102994

(51) Int. Cl.
   *H01L 21/66*  (2006.01)
   *H01L 21/8234*  (2006.01)

(52) U.S. Cl.
   CPC ...... *H01L 22/20* (2013.01); *H01L 21/823475* (2013.01); *H01L 22/32* (2013.01); *H01L 22/10* (2013.01); *H01L 22/12* (2013.01); *H01L 22/14* (2013.01)

(58) Field of Classification Search
   CPC combination set(s) only.
   See application file for complete search history.

(56) References Cited

U.S. PATENT DOCUMENTS

| 6,633,176 | B2 | 10/2003 | Takemoto et al. |
| 2008/0248601 | A1 | 10/2008 | Tsukamoto et al. |
| 2011/0027917 | A1* | 2/2011 | Shinkawata .......... G03F 9/7084 438/16 |
| 2013/0130415 | A1* | 5/2013 | Ahn ........................ H01L 22/14 438/18 |

FOREIGN PATENT DOCUMENTS

| JP | Hei02-181457 A | 7/1990 |
| JP | 3279294 B2 | 2/2002 |
| JP | 2007-027400 A | 2/2007 |
| JP | 2008-198775 A | 8/2008 |
| JP | 2010-062308 A | 3/2010 |

* cited by examiner

*Primary Examiner* — Kyoung Lee
*Assistant Examiner* — Ratisha Mehta
(74) *Attorney, Agent, or Firm* — Studebaker & Brackett PC

(57) ABSTRACT

A method of manufacturing a semiconductor device includes: forming lower-layer wirings for a transistor, a circuit element and a plurality of contact pads on a substrate independently of each other; forming a first feed layer over an entire surface of the substrate on which the lower-layer wirings are formed; patterning the first feed layer to form a test pattern connecting terminals of the transistor to the separate contact pads independently of the circuit element; making a test on the transistor in a stand-alone state by using the contact pad and the test pattern; and after the test, connecting the transistor and the circuit element to form a circuit.

7 Claims, 5 Drawing Sheets

METHOD OF MANUFACTURING SEMICONDUCTOR DEVICE

BACKGROUND OF THE INVENTION

Field of the Invention

The present invention relates to a method of manufacturing a semiconductor device.

Background Art

Conventionally, as a test to detect a failure in a semiconductor device, evaluations of electrical characteristics of a semiconductor device are made by bringing a probe into contact with the semiconductor device in a wafer state after the completion of a wafer process and applying a bias through the probe (see, for example, Japanese Patent No. 3279294 and Japanese Patent Laid-Open No. 02-181457). In some cases, a contact pad for testing is prepared to avoid contact between the probe and a structural member such as a bump on the wafer surface and a test is made by electrically connecting the contact pad to the bump.

In the conventional failure detection method, at least the completion of all wiring layers must be awaited before testing a manufactured semiconductor device. However, semiconductor devices recently developed have a plurality of wiring layers because of the progress of schemes to improve the degree of integration, and losses of time and manufacturing cost are large in a case where a failure is found after all the wiring layers are formed. Further, in some cases of testing a completed semiconductor device, there is a possibility of a failure to make a test about an important parameter depending on the circuit configuration or occurrence of a restriction on a testing condition.

SUMMARY OF THE INVENTION

In view of the above-described problems, an object of the present invention is to provide a semiconductor device manufacturing method which enables making a test before all wiring layers of a semiconductor device are formed and making a test on each of transistors in a stand-alone state regardless of the circuit configuration of the semiconductor device.

According to the present invention, a method of manufacturing a semiconductor device includes: forming lower-layer wirings for a transistor, a circuit element and a plurality of contact pads on a substrate independently of each other; forming a first feed layer over an entire surface of the substrate on which the lower-layer wirings are formed; patterning the first feed layer to form a test pattern connecting terminals of the transistor to the separate contact pads independently of the circuit element; making a test on the transistor in a stand-alone state by using the contact pad and the test pattern; and after the test, connecting the transistor and the circuit element to form a circuit.

In the present invention, the first feed layer is patterned to form a test pattern connecting terminals of the transistor to the separate contact pads independently of the circuit element. A test is made on the transistor in a stand-alone state by using the contact pad and the test pattern. Therefore, the test can be made before all the wiring layers of the semiconductor device are formed. Further, the test can be made on each transistor in a stand-alone state regardless of the circuit configuration of the semiconductor device.

Other and further objects, features and advantages of the invention will appear more fully from the following description.

DETAILED DESCRIPTION OF THE PREFERRED EMBODIMENTS

A method of manufacturing a semiconductor device according to the embodiments of the present invention will be described with reference to the drawings. The same components will be denoted by the same symbols, and the repeated description thereof may be omitted.

First Embodiment

FIGS. 1 to 6 are plan views showing a method of manufacturing a semiconductor device according to a first embodiment of the present invention.

Figure 1:
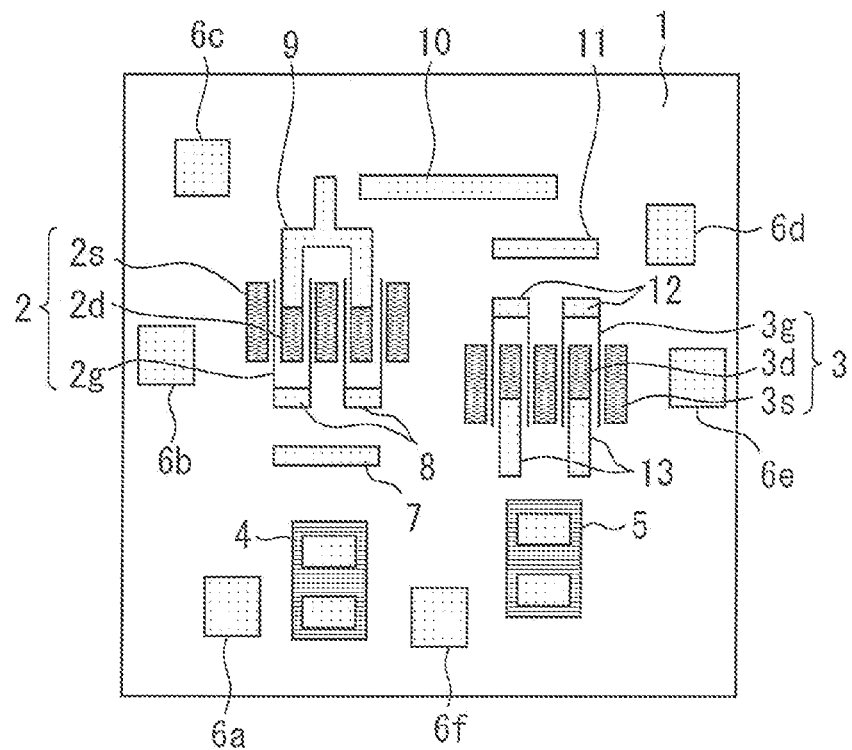
FIGS. 1 to 6 are plan views showing a method of manufacturing a semiconductor device according to a first embodiment of the present invention.
Figure 2:
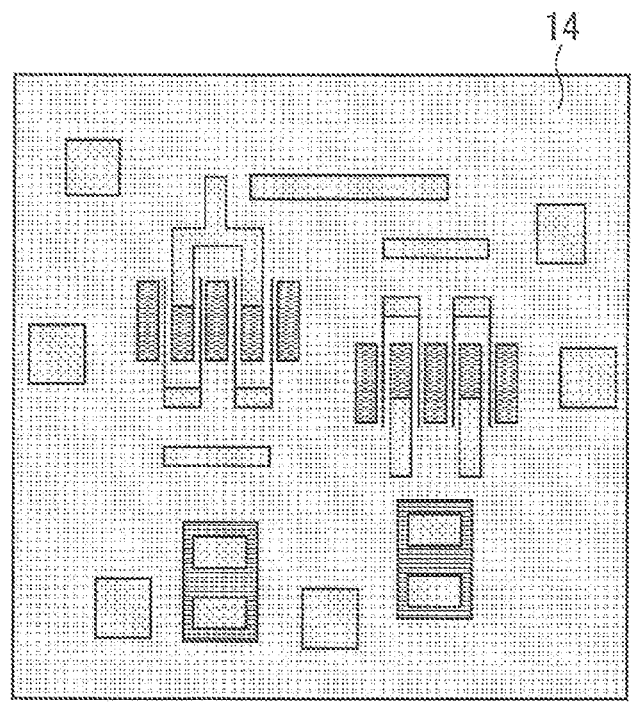

In the present embodiment, as shown in FIG. 1, deposited wirings (lower-layer wirings) for a transistor 2 having a gate 2g, a drain 2d and a source 2s, a transistor 3 having a gate 3g, a drain 3d and a source 3s, MIM capacitors 4 and 5 (circuit elements), contact pads 6a to 6f and wirings 7 to 13 are first formed on a substrate 1 independently of each other. The gate 2g and the drain 2d of the transistor 2 are connected to the wirings 8 and 9, respectively. The gate 3g and the drain 3d of the transistor 3 are connected to the wirings 12 and 13, respectively. Subsequently, as shown in FIG. 2, a first feed layer 14 for forming plating wiring is formed over the entire surface of the substrate 1 on which the lower-layer wirings are formed.

Figure 3:
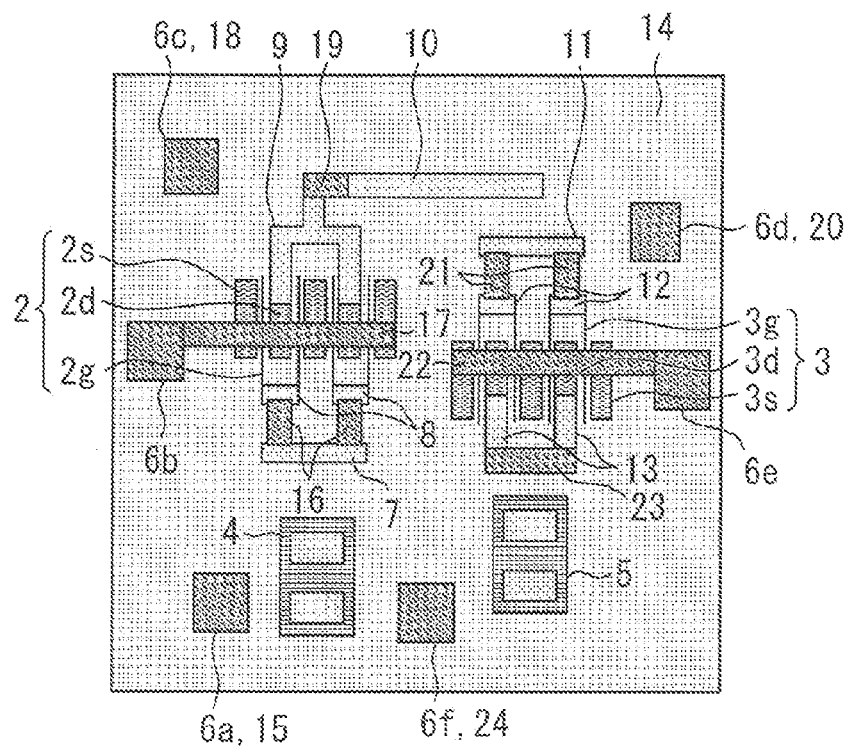

Subsequently, as shown in FIG. 3, plating wirings 15 to 24 are formed on the first feed layer 14 before testing. More specifically, the plating wiring 15 is formed on the deposited wiring for the contact pad 6a. The plating wiring 16 connects the wiring 7 and the wiring 8 to each other. The plating wiring 17 is formed on the deposited wiring for the contact pad 6b to connect the source 2s of the transistor 2 and the contact pad 6b to each other. The plating wiring 18 is formed on the deposited wiring for the contact pad 6c. The plating wiring 19 connects the wiring 9 and the wiring 10 to each other. The plating wiring 20 is formed on the deposited wiring for the contact pad 6d. The plating wiring 21 connects the wiring 11 and the wiring 12 to each other. The plating wiring 22 is formed on the deposited wiring for the contact pad 6e to connect the source 3s of the transistor 3 and the contact pad 6e to each other. The plating wiring 23 is connected to the wiring 13. The plating wiring 24 is formed on the deposited wiring for the contact pad 6f.

Figure 4:
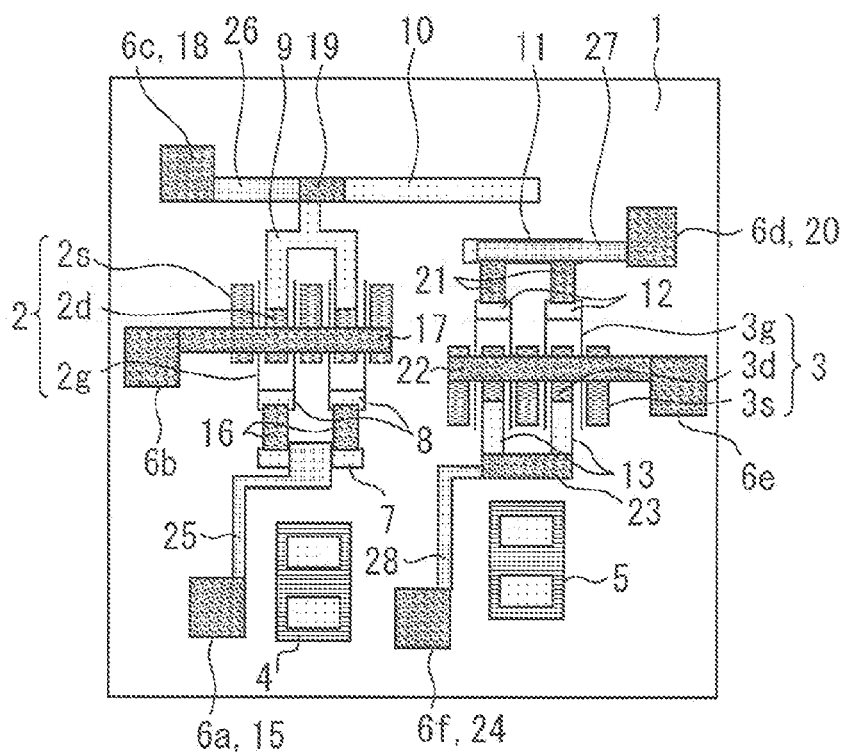

Subsequently, as shown in FIG. 4, test patterns 25 to 28 are formed by patterning the first feed layer 14, the test patterns 25 to 28 connecting the terminals of the transistors 2 and 3 to the separate contact pads independently of the MIM capacitors 4 and 5. More specifically, the test pattern 25 connects to the contact pad 6a the wiring 7 connected to the gate 2g of the transistor 2. The test pattern 26 connects to the contact pad 6c the wiring 9 connected to the drain 2d of the transistor 2. The test pattern 27 connects to the contact pad 6d the wiring 11 connected to the gate 3g of the transistor 3. The test pattern 28 connects to the contact pad 6f the wiring 13 connected to the drain 3d of the transistor 3 and the plating wiring 23.

A test is thereafter made on the transistor 2 in a stand-alone state by using the contact pads 6a, 6b, and 6c and the test patterns 25 and 26. Similarly, a test is made on the transistor 3 in a stand-alone state by using the contact pads 6d, 6e, and 6f and the test patterns 27 and 28.

Figure 5:
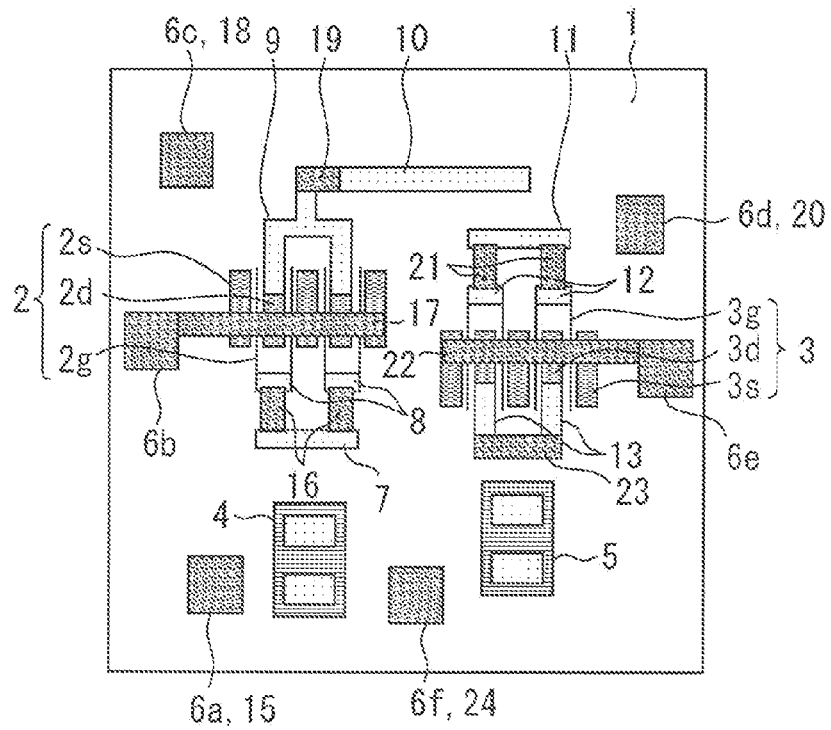
Figure 6:
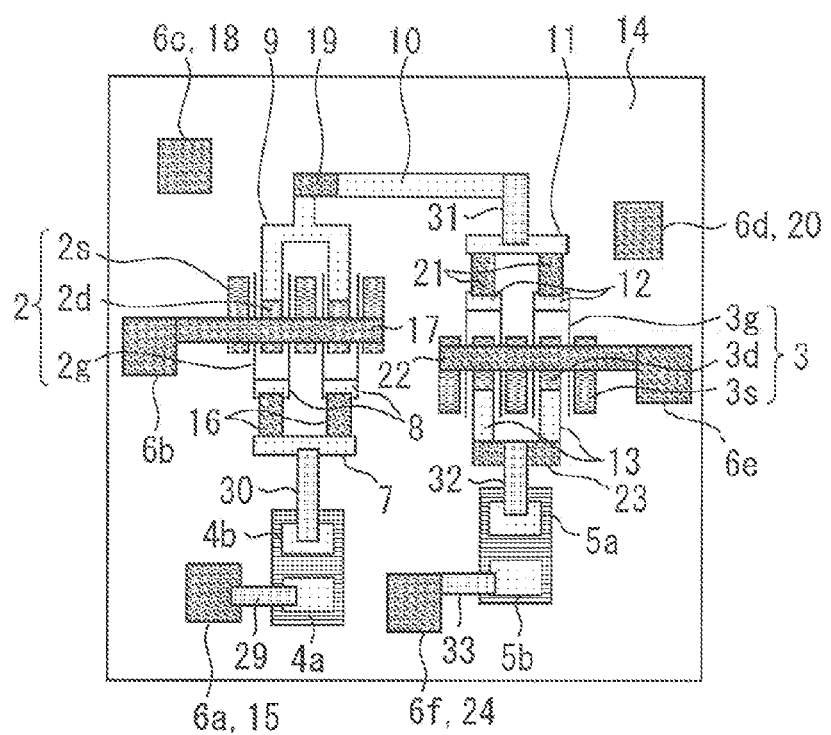

Subsequently, as shown in FIG. 5, the test patterns 25 to 28 are removed by performing, for example, ion milling after testing. Subsequently, as shown in FIG. 6, second-layer and other plating wirings 29 to 33 are formed. More specifically, the plating wiring 29 connects the contact pad 6a and an electrode 4a of the MIM capacitor 4 to each other. The plating wiring 30 connects an electrode 4b of the MIM capacitor 4 and the wiring 7 to each other. The plating wiring 31 connects the wiring 10 and the wiring 11 to each other. The plating wiring 32 connects the plating wiring 23 and an electrode 5a of the MIM capacitor 5. The plating wiring 33 connects an electrode 5b of the MIM capacitor 5 and the contact pad 6f to each other. The transistors 2 and 3 and the MIM capacitors 4 and 5 are thereby connected to form a circuit. This circuit has an RF signal input from the contact pad 6a and outputs an RF signal from the contact pad 6f.

In the present embodiment, as described above, a test is made immediately after the wirings 15 to 24 in the first layer are formed. Since the test can be made before all the wiring layers of the semiconductor device are formed, losses of time and cost can be prevented by performing the test in an early stage in the wafer process and making pass/fail determination on the wafer level. Also, a prediction on yield can be made by making pass/fail determination on the chip level to contribute to the formulation of a production plan. Further, the test can be made on each of the transistors 2 and 3 in a stand-alone state regardless of the circuit configuration of the semiconductor device in contrast with the case where the test is performed on the entire completed semiconductor device. Execution of measurements of parameters which cannot be checked after the completion of the circuit, a check of characteristics of the transistors constituting the semiconductor device, a screening test about malfunctions, etc., is thus enabled.

After testing, the first feed layer 14 is worked, for example, by ion milling to remove the test patterns 25 to 28. The influence of the test patterns 25 to 28, for example, on RF characteristics of the completed semiconductor device is avoided thereby.

Second Embodiment

Figure 7:
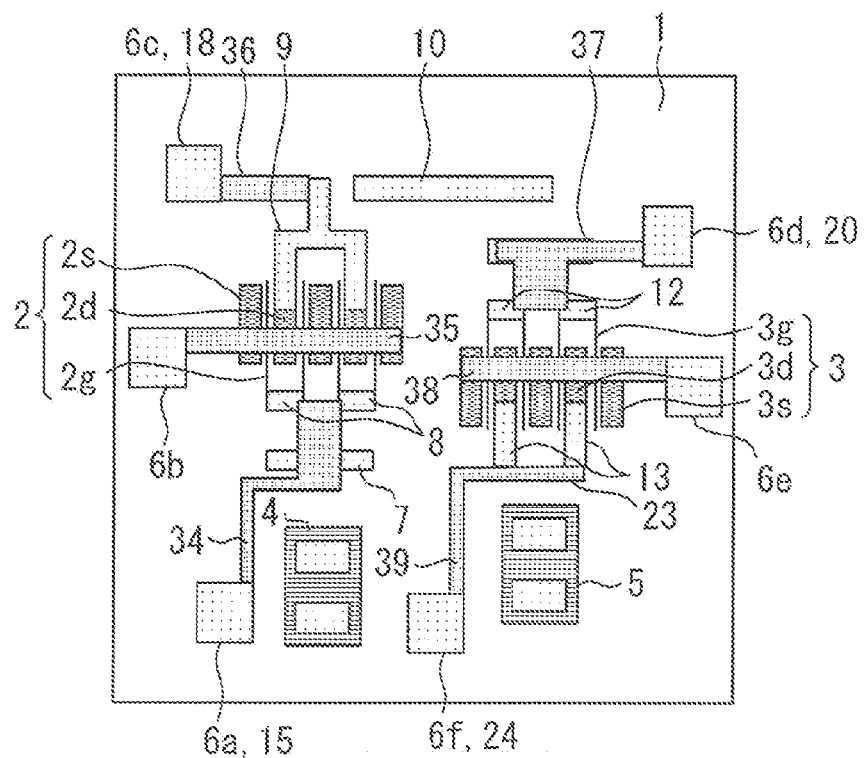
FIGS. 7 and 8 are plan views showing a method of manufacturing a semiconductor device according to a second embodiment of the present invention.
Figure 8:
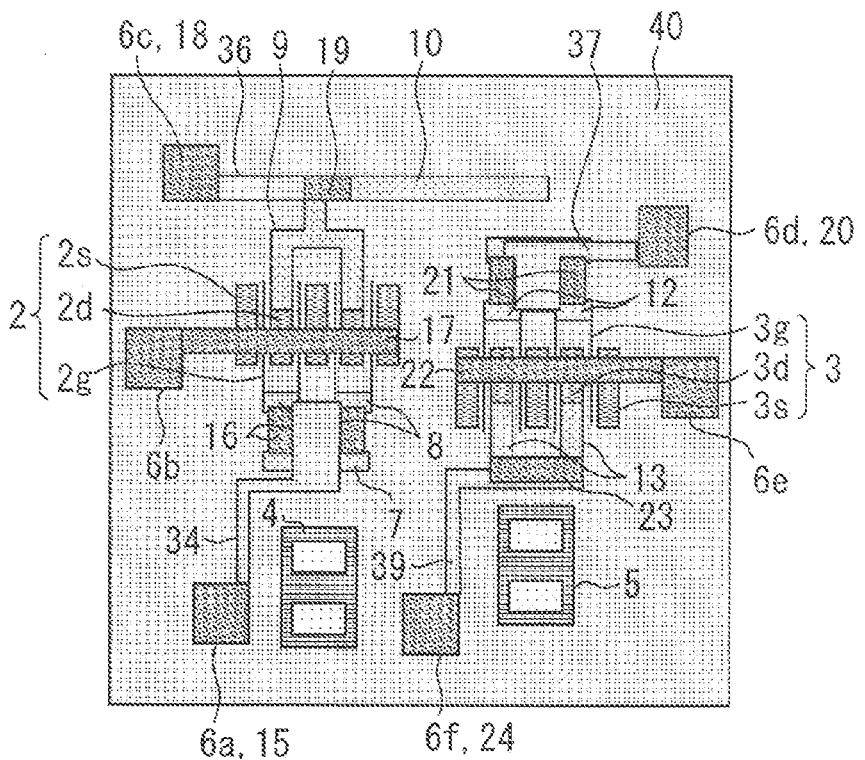

FIGS. 7 and 8 are plan views showing a method of manufacturing a semiconductor device according to a second embodiment of the present invention. In the second embodiment, deposited wirings are first formed like those in the first embodiment, as shown in FIG. 1, and the first feed layer 14 formed over the entire surface of the substrate 1, as shown in FIG. 2.

Subsequently, as shown in FIG. 7, before forming plating wiring, test patterns 34 to 39 are formed by patterning the first feed layer 14, the test patterns 34 to 39 connecting the terminals of the transistors 2 and 3 to the separate contact pads independently of the MIM capacitors 4 and 5. More specifically, the test pattern 34 connects to the contact pad 6a the wiring 8 connected to the gate 2g of the transistor 2. The test pattern 35 connects the source 2s of the transistor 2 and the contact pad 6b to each other. The test pattern 36 connects to the contact pad 6c the wiring 9 connected to the drain 2d of the transistor 2. The test pattern 37 connects to the contact pad 6d the wiring 12 connected to the gate 3g of the transistor 3. The test pattern 38 connects the source 3s of the transistor 3 and the contact pad 6e to each other. The test pattern 39 connects to the contact pad 6f the wiring 13 connected to the drain 3d of the transistor 3.

A test is thereafter made on the transistor 2 in a stand-alone state by using the contact pads 6a, 6b, and 6c and the test patterns 34 to 36. Similarly, a test is made on the transistor 3 in a stand-alone state by using the contact pads 6d, 6e, and 6f and the test patterns 37 to 39.

Subsequently, as shown in FIG. 8, a second feed layer 40 for forming plating wiring is formed over the entire surface of the substrate 1 after a test. Plating wirings 15 to 24 are formed on the second feed layer 40, as are those shown in FIG. 3 for the first embodiment.

Subsequently, the exposed second feed layer 40 and test patterns 34 to 39 are removed, for example, by ion milling. Subsequently, second-layer and other plating wirings 29 to 33 are formed, as are those shown in FIG. 6 for the first embodiment. The transistors 2 and 3 and the MIM capacitors 4 and 5 are thereby connected to form a circuit.

In the present embodiment, as described above, a test is performed before the plating layer is formed, thus obtaining the same advantage as that of the first embodiment. Further, all the test patterns 34 to 39 are formed on the first feed layer 14, thereby improving the degree of freedom of pattern layout.

Third Embodiment

Figure 9:
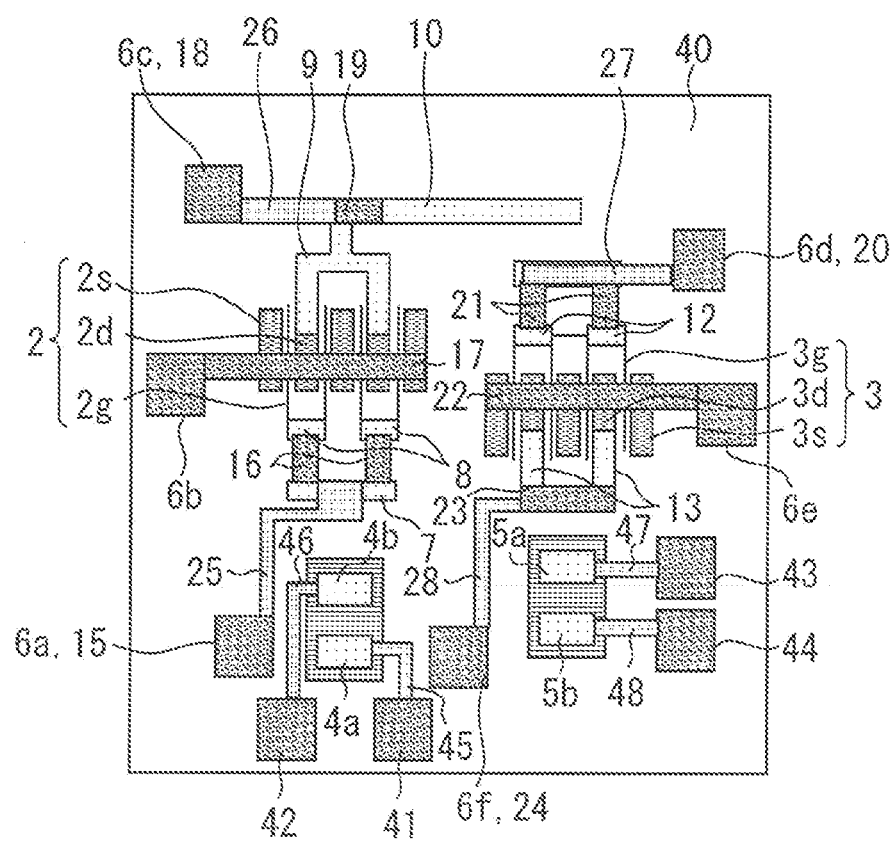
FIG. 9 is a plan view showing a method of manufacturing a semiconductor device according to a third embodiment of the present invention.

FIG. 9 is a plan view showing a method of manufacturing a semiconductor device according to a third embodiment of the present invention. In the third embodiment, a step of forming contact pads 41 to 44 on the substrate 1 independently of each other is performed as well as the process step shown in FIG. 1 for the first embodiment. Subsequently, the same process steps as those shown in FIGS. 2 and 3 for the first embodiment are performed.

Subsequently, as shown in FIG. 9, test patterns 45 to 48, as well as the test patterns 25 to 28 formed in the same way as those shown in FIG. 4 for the first embodiment, are formed by patterning the first feed layer 14. The test patterns 45 to 48 connect the electrodes 4a and 4b of the MIM capacitor 4 and the electrodes 5a and 5b of the MIM capacitor 5 respectively to the contact pads 41 to 44 separate from the transistors 2 and 3.

A test is thereafter made on the MIM capacitor 4 in a stand-alone state by using the contact pads 41 and 42 and the test patterns 45 and 46. Similarly, a test is made on the MIM capacitor 5 in a stand-alone state by using the contact pads 43 and 44 and the test patterns 47 and 48. A test can thus be made on each of the MIM capacitors 4 and 5 in a stand-alone state. The other process steps and the advantage of the present embodiment are the same as those of the first embodiment. A test may be made on each of the MIM capacitors 4 and 5 in a stand-alone state when a manufacturing process formed as a combination of the manufacturing process according to the second embodiment and the manufacturing process of the present embodiment is performed.

The MIM capacitors 4 and 5 have been described as circuit elements by way of example in the descriptions of the first to third embodiments. However, the present invention is not limited to this. The same advantage can also be obtained when other circuit elements such as resistors or inductors are used.

Also, deposited wirings (lower-layer wirings) below plating wiring may be interposed between test patterns. Intersection of test patterns is thereby enabled to improve the degree of freedom of layout at the time of preparation of test patterns.

Masks or process conditions for forming a circuit after a test may be changed based on the results of the test to optimize circuit parameters of the circuit. The circuit parameters are, for example, the inductance value of an inductor, the capacitance value of a capacitor, the configuration of a bias circuit and a resistance value. More specifically, not only an operation to change the resistance value by laser trimming or the like but also other operations including an operation to optimize the circuit configuration by changing masks after the testing step and an operation to change the metal thickness by changing process conditions are performed. An improvement in yield can thereby be achieved to reduce a loss of cost.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-102994, filed on May 20, 2015 including specification, claims, drawings and summary, on which the Convention priority of the present application is based, is incorporated herein by reference in its entirety.

What is claimed is:

1. A method of manufacturing a semiconductor device comprising:
    forming lower-layer wirings for a transistor, a circuit element and a plurality of contact pads on a substrate independently of each other;
    forming a first feed layer over an entire surface of the substrate on which the lower-layer wirings are formed;
    patterning the first feed layer to form a test pattern connecting terminals of the transistor to the separate contact pads independently of the circuit element;
    making a test on the transistor in a stand-alone state by using the contact pad and the test pattern; and
    after the test, connecting the transistor and the circuit element to form a circuit.

2. The method of manufacturing a semiconductor device of claim 1, further comprising forming a plating wiring on the first feed layer before the test.

3. The method of manufacturing a semiconductor device of claim 1, further comprising:
    forming a second feed layer over the entire surface of the substrate after the test; and
    forming a plating wiring on the second feed layer.

4. The method of manufacturing a semiconductor device of claim 1, wherein the test pattern connects the circuit element to the contact pad separate from the transistor, and
    a test is made on the circuit element in a stand-alone state by using the contact pad and the test pattern.

5. The method of manufacturing a semiconductor device of claim 1, further comprising removing the test pattern after the test.

6. The method of manufacturing a semiconductor device of claim 1, wherein the lower-layer wiring is interposed in the test pattern.

7. The method of manufacturing a semiconductor device of claim 1, wherein a mask or a process condition for forming the circuit after the test is changed based on a result of the test to optimize a circuit parameter of the circuit.

* * * * *